United States Patent
Sun et al.

(10) Patent No.: US 9,825,600 B2
(45) Date of Patent: Nov. 21, 2017

(54) CLASS D AMPLIFIER AND ELECTRONIC DEVICES INCLUDING THE SAME

(71) Applicants: Hisense Electric Co., Ltd., Qingdao (CN); Hisense USA Corp., Suwanee, GA (US); Hisense International Co., Ltd., Qingdao (CN)

(72) Inventors: Xuebin Sun, Qingdao (CN); Jin Liu, Qingdao (CN)

(73) Assignees: HISENSE ELECTRIC CO., LTD., Qingdao (CN); HISENSE USA CORP., Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 0 days.

(21) Appl. No.: 14/540,855

(22) Filed: Nov. 13, 2014

(65) Prior Publication Data

US 2016/0065140 A1 Mar. 3, 2016

(30) Foreign Application Priority Data

Aug. 29, 2014 (CN) .......................... 2014 1 0438799

(51) Int. Cl.
*H03F 3/38* (2006.01)
*H03F 3/217* (2006.01)
*H03F 1/02* (2006.01)
*H03F 3/195* (2006.01)
*H03F 3/24* (2006.01)
*H03F 3/45* (2006.01)

(52) U.S. Cl.
CPC ........... *H03F 3/217* (2013.01); *H03F 1/0222* (2013.01); *H03F 3/195* (2013.01); *H03F 3/245* (2013.01); *H03F 3/45475* (2013.01); *H03F 2200/171* (2013.01); *H03F 2200/78* (2013.01); *H03F 2203/45512* (2013.01); *H03F 2203/45594* (2013.01)

(58) Field of Classification Search
CPC .................................. H03F 3/38; H03F 3/217
USPC ........................................ 330/10, 207 A, 251
See application file for complete search history.

(56) References Cited

U.S. PATENT DOCUMENTS 7,378,904 B2 * 5/2008 Risbo .............................. 330/10
7,746,127 B2 * 6/2010 Miyazaki et al. ............. 327/112
(Continued)

FOREIGN PATENT DOCUMENTS

| CN | 101217262 | 7/2008 |
|----|-----------|--------|
| CN | 101741325 | 6/2010 |
| JP | 2005204217 | 7/2005 |

OTHER PUBLICATIONS

Office Action issued in corresponding Chinese App. No. 201410438799.2, dated Oct. 28, 2016 (English translation included).

(Continued)

*Primary Examiner* — Henry Choe
(74) *Attorney, Agent, or Firm* — Brinks Gilson & Lione (57) ABSTRACT

An electronic device includes a waveform generator, a comparator, and an amplifier. The waveform generator receives a voltage from a power supply to the electronic device and outputs a voltage waveform signal. The comparator compares an input signal and the voltage waveform signal to output a first pulse-width-modulated signal. The amplifier receives the first pulse-width-modulated signal and outputs a second pulse-width-modulated signal.

18 Claims, 5 Drawing Sheets

(56) References Cited

U.S. PATENT DOCUMENTS

| | | | |
|---|---|---|---|
| 8,098,091 B1* | 1/2012 | Anderskouv et al. | 330/11 |
| 8,139,792 B2* | 3/2012 | Magrath | 381/120 |
| 9,041,461 B2* | 5/2015 | Chang et al. | 330/10 |
| 2004/0125968 A1* | 7/2004 | Pearce et al. | 381/120 |

OTHER PUBLICATIONS

Search Report issued by SIPO for corresponding Chinese App. No. 201410438799.2, dated Oct. 12, 2016 (English translation included).

* cited by examiner

CLASS D AMPLIFIER AND ELECTRONIC DEVICES INCLUDING THE SAME

CROSS-REFERENCE TO RELATED APPLICATIONS

This application claims priority to Chinese Patent Application No. 201410438799.2, filed on Aug. 29, 2014, which is hereby incorporated by reference in its entirety.

FIELD

The present disclosure relates to electronic devices, and in particular, to electronic devices including a class D amplifier.

BACKGROUND

A class-D amplifier is an electronic amplifier in which the amplifying devices (such as transistors) operate as electronic switches, instead of as linear gain devices as in other amplifiers. Generally, the signal to be amplified is a train of constant amplitude pulses, so the active devices switch rapidly back and forth between a fully conductive and nonconductive state. The analog signal to be amplified is converted to a series of binary waveform by pulse width modulation (PWM), pulse density modulation or other modulation before being applied to the amplifier. After amplification, the output pulse train is converted back to an analog signal by passing through a low pass filter. The class-D amplifier is more efficient than analog amplifiers because it reduces power waste as heat dissipation.

Figure 1:
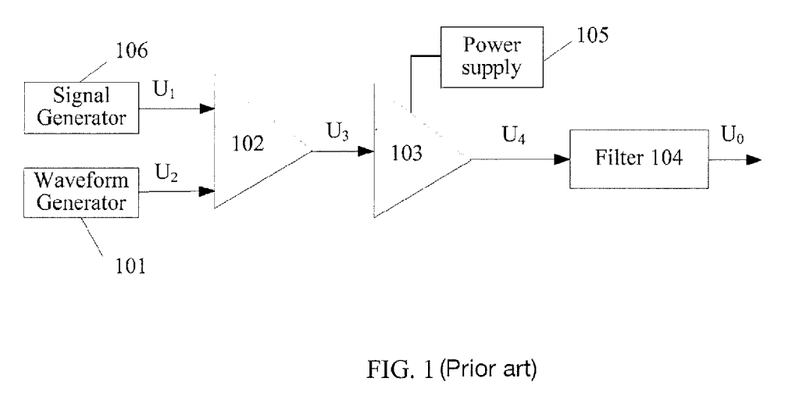
FIG. 1 is a block diagram of a class D amplifier in the prior art.

FIG. 1 shows a class D amplifier that includes a waveform generator 101, a comparator 102, a power amplifier circuit 103, a first filter circuit 104, a power supply 105 and a signal generator 106. The power supply 105 supplies operating voltage to the power amplifier circuit 103. The signal generator 106 generates a first input signal U1 and the waveform generator 101 outputs a second signal U2. The first and second input signals U1 and U2 are input to the comparator 102 which outputs a PWM signal U3. The PWM signal U3 goes through the power amplifier circuit 103 that outputs the amplified PWM signal U4. The amplified PWM signal U4 is input to the first filter 104 to obtain the audio output signal U0. The power of the output signal U0 depends on the duty cycle of amplified PWM signal U4 and the amplitude of the power supply 105 to the power amplification circuit 103. Thus, when the power supply 105 fluctuates, the audio output signal $U_O$ may fluctuate even when input signals $U_1$ and $U_2$ remain the same. In short, the fluctuation of the power supply 105 causes audio distortion of the output signal $U_O$. The users may hear the sound changes abruptly in that case. Thus, there is a need to a class D amplifier that can smooth the output signal $U_O$.

Figure 2:
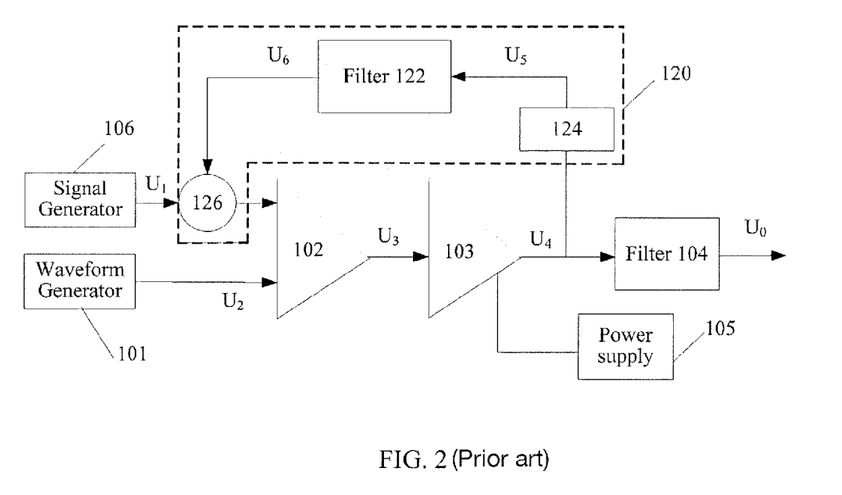
FIG. 2 a second block diagram of a class D amplifier in the prior art.

One way to solve the above problem is to introduce a feedback circuit in the class D amplifier. As shown in FIG. 2, the feedback circuit 120 within the dashed box includes a filter circuit 122, a sampling circuit 124, and an integrator 126. The sampling circuit 124 takes the PWM signal $U_4$ of the power amplifier 103 and outputs sampled PWM signal $U_5$. The sampled PWM signal $U_5$ is filtered by the filter circuit 122 to receive the signal $U_6$, which passes through the integrator 126 and accumulates the input signal $U_1$. The integrator 126 adjusts the amplitude of the input signal $U_1$ according to the signal $U_6$. Thus, the output of the waveform generator compares $U_2$ with the adjusted input signal $U_2$, thus making the output signal $U_3$ and the signal $U_4$ changes accordingly, which suppresses undesired change of the power $U_O$. The feedback circuit 120, however, includes additional filter circuits after sampling. The feedback circuit 120 has to filter out the clutter and correct the phase offset of the analog signal, which leads to complex design of the feedback circuit. Further, the feedback circuit 120 introduces active device such as the integrator 126, resulting in an increase in circuit costs.

Thus, there is a need to a class D amplifier that can smooth the output signal $U_O$ and reduces the complexity and cost of the feedback circuit.

SUMMARY

In one aspect, an electronic device includes a waveform generator, a comparator, and an amplifier. The waveform generator receives a voltage from a power supply to the electronic device and outputs a voltage waveform signal. The comparator compares an input signal and the voltage waveform signal to output a first pulse-width-modulated signal. The amplifier receives the first pulse-width-modulated signal and outputs a second pulse-width-modulated signal.

In a second aspect, a method is provided for amplifying signal. In the method, a waveform generator in an electronic device receives a voltage from a power supply and outputs a voltage waveform signal. A comparator of the electronic device compares an input signal and the voltage waveform signal to output a first pulse-width-modulated signal. An amplifier of the electronic device receives the first pulse-width-modulated signal and outputs a second pulse-width-modulated signal.

In another aspect, a system is provided system. The system includes a class-D amplifier directly connected to a power supply. The class-D amplifier includes: a waveform generator and a comparator. The waveform generator receives a voltage from the power supply and outputs a voltage waveform signal. The comparator compares an input signal and the voltage waveform signal to output a first pulse-width-modulated signal. The voltage waveform signal includes a triangular wave signal that serves as a negative feedback control signal to the class-D amplifier.

BRIEF DESCRIPTION OF THE DRAWINGS

The disclosure will become more fully understood from the detailed description given herein below for illustration only, and thus are not limitative of the disclosure.

DETAILED DESCRIPTION OF THE DRAWINGS

Reference throughout this specification to "embodiments," "an embodiment," "example embodiment," or the like in the singular or plural means that one or more particular features, structures, or characteristics described in connection with an embodiment is included in at least embodiments of the present disclosure. Thus, the appearances of the phrases "in embodiments" or "in an embodiment," "in an example embodiment," or the like in the singular or plural in various places throughout this specification are not necessarily all referring to the same embodiment. Furthermore, the particular features, structures, or characteristics may be combined in any suitable manner in one or more embodiments.

The terminology used in the description of the disclosure herein is for the purpose of describing particular examples only and is not intended to be limiting of the disclosure. As used in the description of the disclosure and the appended claims, the singular forms "a," "an," and "the" are intended to include the plural forms as well, unless the context clearly indicates otherwise. Also, as used in the description herein and throughout the claims that follow, the meaning of "in" includes "in" and "on" unless the context clearly dictates otherwise. It will also be understood that the term "and/or" as used herein refers to and encompasses any and all possible combinations of one or more of the associated listed items. It will be further understood that the terms "may include," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "module" or "unit" may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module or unit may include memory (shared, dedicated, or group) that stores code executed by the processor.

Figure 3:
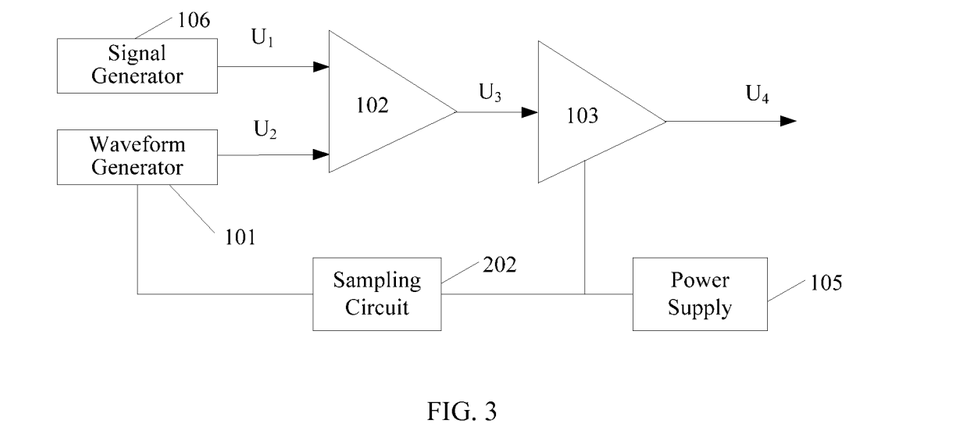
FIG. 3 is an example schematic structural diagram of an electronic device according to the present disclosure.

FIG. 3 is an example schematic structural diagram of an electronic device according to the present disclosure. The electronic device may be a television, a smart phone, a laptop, a tablet, or any other device that includes a speaker and a power supply. The electronic device includes a waveform generator 101, a comparator 102, a power amplifier circuit 103, a first filter circuit 104, a power supply 105 and a signal generator 106. The waveform generator 101 may include an integrated circuit (IC) that produces accurate, high-frequency triangle, sawtooth, sine, square, and pulse waveforms with a few external components. The output frequency may be controlled over a frequency range by an internal voltage reference and an external resistor. The duty cycle may be varied over a wide range by applying a duty control signal, facilitating pulse-width modulation. Frequency modulation and frequency sweeping may be achieved in similar fashion. The duty cycle and frequency controls may be independent.

The comparator 102 may include an IC that compares two voltages or currents and outputs a signal. The comparator 102 may include a specialized high-gain differential amplifier circuit. The power amplifier circuit 103 may be an IC that includes a plurality of pins designated for different input and output signals. The electronic device may include additional components such as speakers, display screens, input modules, etc.

In FIG. 3, the power supply 105 supplies power to the electronic device. The power supply 105 also provides an input signal to the sampling circuit 202, which samples the input power signal and sends the sampled power signal to the waveform generator 101. The sampled power signal may be a voltage signal. In short, the waveform generator 101 receives the voltage signal from the power supply 105 to the electronic device and outputs a voltage waveform signal $U_2$ to the amplifier 102. The signal $U_2$ may include a high frequency triangular wave. The waveform generator 101 receive the voltage signal directly from the power supply 105 when the voltage signal is within a preset range. Alternatively, the waveform generator 101 may receive a sampled voltage signal at least partially related to the voltage signal of the power supply 105. The waveform generator 101 may include a non-sinusoidal waveform generator that generates the voltage waveform signal $U_2$ based on the voltage signal. The electronic device may not need to include an integrator. For example, the electronic device may not need an integrator in the feedback control loop.

The comparator 102 compares an analog input signal $U_1$ from the signal generator 106 and the voltage waveform signal $U_2$ to output a first pulse-width-modulated (PWM) signal $U_3$. Note that the PWM signal may also be referred as a pulse-width-modulation signal. For example, the comparator 102 may compare a high frequency triangular wave $U_2$ with the audio input signal $U_1$ to generate a series of pulses of which the duty cycle is directly proportional with the instantaneous value of the audio signal. The comparator 102 may then drive a MOS gate driver which in turn drives a pair of high-power switches to produces an amplified replica of the comparator's PWM signal. An output filter may then remove the high-frequency switching components of the PWM signal and recover the audio information that a speaker can use. The amplifier 103 receives the first PWM signal $U_3$ and outputs a second PWM signal $U_4$.

Here, because the input voltage waveform signal $U_2$ is from the power supply, it reflects the fluctuation of the power supply. When the power supply increases, the input voltage waveform signal $U_2$ also increase. The first PWM signal $U_3$ is partially controlled by the input voltage waveform signal $U_2$. When the input voltage waveform signal $U_2$ increases, the first PWM signal $U_3$ will have a smaller duty cycle. At the same time, the power supply also supplies operating voltage to the power amplifier circuit 103. An increased operating voltage alone may result an increased $U_4$. The smaller duty cycle of $U_3$ thus may cancel at least a part of the effect of the increased operating voltage and reduce the undesired fluctuation of the signal $U_4$.

Similarly, when the power supply decreases, the input voltage waveform signal $U_2$ also decrease. The decrease of the input voltage waveform signal $U_2$ will cause the first PWM signal $U_3$ to have a greater duty cycle. At the same time, the power supply also supplies operating voltage to the power amplifier circuit 103. A decreased operating voltage alone may result a decreased $U_4$. The greater duty cycle of $U_3$ thus may cancel at least a part of the effect of the decreased operating voltage and reduce the undesired fluctuation of the signal $U_4$. In other words, the combination effect of the power supply on the comparator 102 and the amplifier 103 has an effect of a feedback circuit with less hardware components and much less cost.

Figure 4:
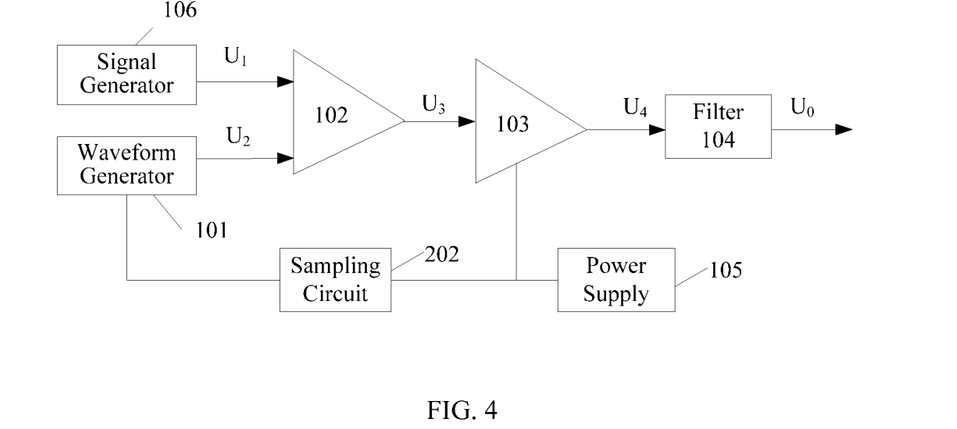
FIG. 4 is an example block diagram of a class D amplifier according to the present disclosure.

FIG. 4 is an example block diagram of a class D amplifier according to the present disclosure. The class D amplifier further includes a filter 104 that removes the high-frequency switching components of the second PWM signal U$_4$ and recovers the analog signal information. The analog input signal may be an audio signal or other type of analog signals. The filter 104 may include a low pass filter that that passes signals with a frequency lower than a certain cutoff frequency and attenuates signals with frequencies higher than the cutoff frequency. The amount of attenuation for each frequency depends on the filter design. The filter 104 may include a band pass filter that passes frequencies within a certain range and attenuates frequencies outside that range. The filter 104 may include other types of filters if necessary. The class D amplifier may be implemented in a single IC. In that case, the IC may include all the above components in FIG. 4 in a single chip. The IC may include a power supply pin that is internally connected to the waveform generator in the chip.

Figure 5:
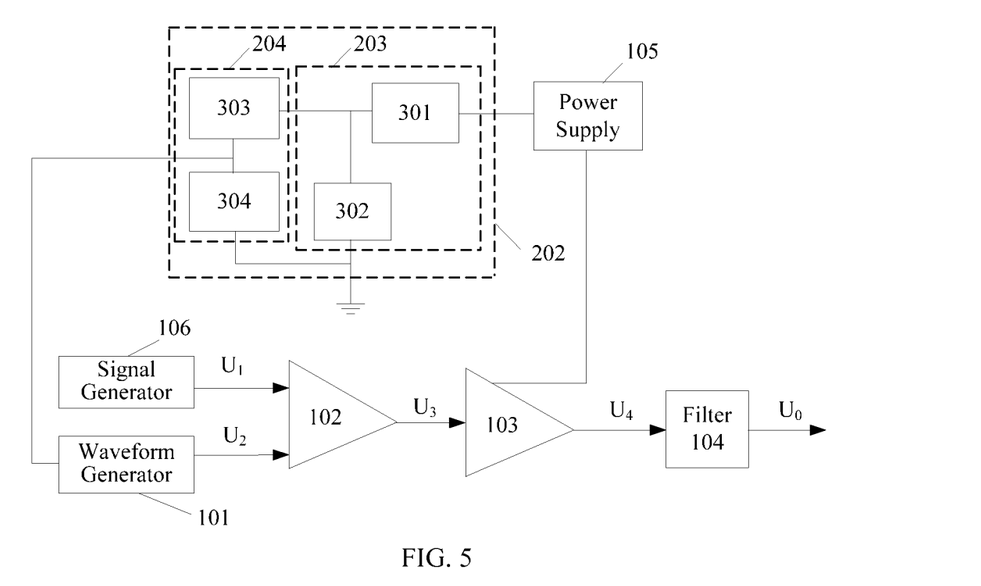
FIG. 5 is an example block diagram of a class D amplifier according to the present disclosure.

FIG. 5 is an example block diagram of a class D amplifier according to the present disclosure. The D amplifier includes a sampling circuit 202. The sampling circuit 202 includes: a second filter circuit 203 and a voltage dividing circuit 204.

The second filter circuit 203 receives an input from the power supply 105. The second filter circuit 203 outputs a signal to the voltage dividing circuit 204. The voltage dividing circuit 204 outputs a voltage signal to the input terminal of the waveform generator 101. The second filter circuit 203 filters the power supply signal from the power supply 105 while the voltage divider circuit 204 divides the filtered voltage signal from the second filer circuit 203.

The second filter circuit 203 may include: a first resistor unit 301 and a capacitor unit 302. The voltage dividing circuit 204 may include: a second resistor unit 303 and a third resistor unit 304. It should be understood that the sampling circuit 202 in FIG. 5 is only for illustration purpose. A first end of the first resistor unit 301 is connected to the power supply 105 and a second end of the first resistor unit 301 is connected to the first end of the second resistor unit 303. The first end of the capacitor unit 302 is connected to the second end of the first resistor unit 301. The second end of the capacitor unit 302 is connected to ground. The second end of the second resistor unit 303 is connected to a first input of the waveform generator 101. The first end of the third resistor 304 is connected to of the second end of the second resistor unit 303. A second end of the second resistor unit 303 is connected to the ground.

The sampling circuit 202 may include additional circuitry components. The sampling circuit 202 may be implemented using other alternative circuitry.

Figure 6:
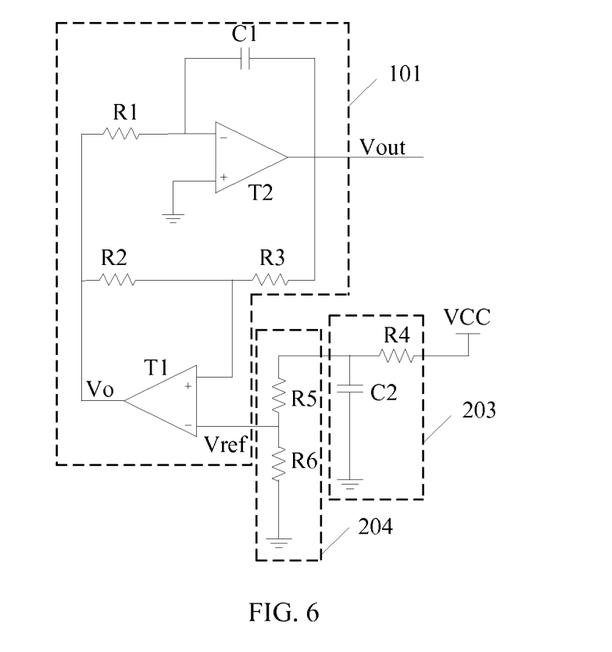
FIG. 6 is an example block diagram of a sampling circuit of a class D amplifier.

FIG. 6 is an example block diagram of a sampling circuit of a class D amplifier. The class D amplifier includes a waveform generator 101, which may be a non-sinusoidal waveform generator that generates a non-sinusoidal waveform. For example, the non-sinusoidal waveform generator maybe a triangular wave generator that generates a triangular wave. Alternatively, the non-sinusoidal waveform generator may be a sawtooth wave generator that generates a sawtooth wave. In FIG. 6, the waveform generator 101 includes two operational amplifiers T1 and T2, three resistors R1, R2, and R3, and a capacitor C1.

In FIG. 6, the class D amplifier further includes: a second filter circuit 203 and a voltage dividing circuit 204. The second filter circuit 203 may include a resistor-capacitor circuit (RC circuit), which may also be called as a RC filter.

The RC filter 203 shown in FIG. 6 is a first order RC circuit that includes one resistor R3 and one capacitor C2, which is the simplest type of RC circuit. The filter circuit 203 may include additional circuitry components and be implemented differently. The voltage dividing circuit 204 includes two resistors R5 and R6 connected in series, with the input voltage applied across the two resistors and the output voltage emerging from the connection between them. Here, the second filter circuit 203 and a voltage dividing circuit 204 work together as the sampling circuit. The input of the sampling circuit is the voltage supply VCC while the output voltage of the sampling circuit is Vref.

In FIG. 6, Vo represents the output voltage of the operational amplifier T1, where the operational amplifier T1 includes a maximum output voltage Vo Hand the minimum output voltage VoL. Vout represents the output voltage of the operational amplifier T2, which is the output voltage of the triangular waveform generator 101. The operational amplifier T2 has a maximum output voltage VoutH and a minimum output voltages VoutL.

The output voltage Vout of the triangular waveform generator 101 depends on the input Vref of the operational amplifier T1 on the inverting terminal. From the characteristics of the operational amplifier, when two input terminals of the operational amplifier T1 have the same input voltages, the output of the operational amplifier T2 may reach its maximum or minimum VoutH or VoutL.

For example, in the first situation, when the output of the operational amplifier T1 is at a high level, it may continuously charge to C1 and the output voltage of the operational amplifier T2 is reduced to the lowest point. As a result, the non-inverting input of the operational amplifier T1 and the inverting input terminal of the operational amplifier T1 have equal input voltages.

$$Vref = VoutL\frac{R2}{R2+R3} + VoH\frac{R3}{R2+R3} \qquad \text{(Equation 1)}$$

In the second situation, when the output of the operational amplifier T1 is at a low level, it may continuously discharge the capacitor C1 and the output voltage of the operational amplifier T2 is increased to the highest point. As a result, the non-inverting input of the operational amplifier T1 and the inverting input terminal of the operational amplifier T1 have equal input voltages.

$$Vref = VoutH\frac{R2}{R2+R3} + VoL\frac{R3}{R2+R3} \qquad \text{(Equation 2)}$$

Thus, combining equations 1 and 2, VoutH and VoutL may be determined according to the following two equations. In Equation 3 and Equation 4, the resistances of the two resistors R2 and R3 are predetermined, the maximum and minimum output voltage VoH and VoL are predetermined. Thus, so long as the input voltage Vref changes, the output voltage of the operational amplifier T2 will change accordingly. Specifically, when Vref increases, VoutH and VoutL increase; when Vref becomes decreases, VoutH and VoutL also decrease. Thus, the output of the triangular waveform generator 101 and the voltage of the power supply VCC are a positively correlated. In other words, if the power supply voltage fluctuates, the output voltage will follow the amplitude of the triangular waveform generator 101 and change accordingly.

$$VoutH = \frac{R2+R3}{R2}Vref - \frac{R3}{R2}VoL \qquad \text{(Equation 3)}$$

$$VoutL = \frac{R2+R3}{R2}Vref - \frac{R3}{R2}VoH \qquad \text{(Equation 4)}$$

Figure 7:
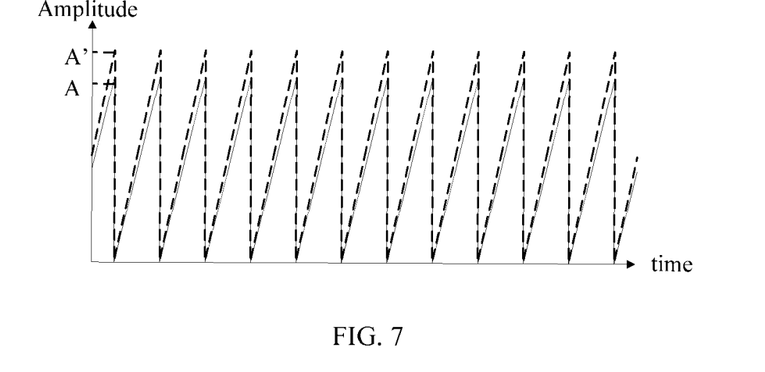
FIG. 7 is an example diagram that illustrates the output change of a waveform generator.

FIG. 1 is an example diagram that illustrates the output change of a waveform generator. In FIG. 7, the magnitude of the output voltage changes. Here, as shown by the solid line, the maximum value of the amplitude of Vout is A before Vref increase. As Vref increases, the output voltage Vout of the triangular waveform generator 101, which is shown using the broken line, also increases. The maximum value of the amplitude A' is greater than A.

Figure 8:
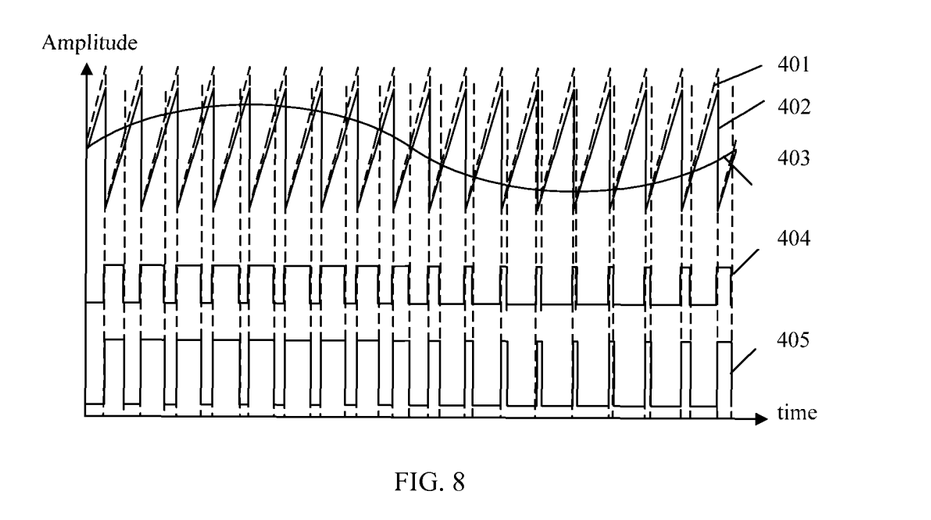
FIG. 8 is an example diagram that illustrates the output change a class D amplifier according to the present disclosure.

FIG. 8 is an example diagram that illustrates the output change a class D amplifier according to the present disclosure. Waveform 401 shows the output waveform of the triangular waveform generator waveform 101, which is adjusted by the sampling circuit 202. Waveform 402 represents original waveform of the triangular waveform generator output waveform 101, which is not adjusted by the sampling circuit 202. Waveform 403 shows a waveform of an analog signal such as an audio input signal. Waveform 404 shows the waveform of the output signal $U_3$ of the comparator 102. Waveform 405 shows the power amplifier circuit 103 of the output signal $U_4$.

In the above embodiments, when the power supply VCC becomes larger, the voltage Vref output from the sampling circuit also becomes larger, i.e., the signal Vref at the inverting input terminal of the operational amplifier T1 becomes larger. From Equations 3 and 4, when Vref becomes larger, the output voltage of the operational amplifier T2 becomes larger. Thus, the output voltage of the triangular waveform generator becomes larger. As can be seen from FIG. 8, the waveform from the waveform of the waveform 402 becomes waveform 401, where the amplitude of the triangular wave becomes large. The comparator 102 compares the audio input signal and the increased triangular signal. The duty ratio of the first PWM output signal $U_3$ will be smaller. The magnitude of the output PWM signal $U_4$ increases while the duty cycle of the second PWM signal $U_4$ decreases following the duty cycle of the first PWM output signal $U_3$. Thus, the output of the PWM power amplifier circuit may be stabilized because the increased amplitude and the smaller duty cycle may cancel at least a part of each other, which achieves the effect of negative feedback. Therefore, the final power of the output signal $U_0$ does not fluctuate following the fluctuation of the supply voltage VCC. The stability of the output power ensures the quality of the audio output signal.

Similarly, when the power supply VCC becomes smaller, the voltage Vref output from the sampling circuit also becomes smaller, i.e., the signal Vref at the inverting input terminal of the operational amplifier T1 becomes smaller. From Equations 3 and 4, when Vref becomes smaller, the output voltage of the operational amplifier T2 becomes smaller. Thus, the output voltage of the triangular waveform generator becomes smaller. The comparator 102 compares the audio input signal and the decreased triangular signal. The duty ratio of the first PWM output signal $U_3$ will be larger. The magnitude of the output PWM signal $U_4$ decreases while the duty cycle of the second PWM signal $U_4$ increases following the duty cycle of the first PWM output signal $U_3$. Thus, the output of the PWM power amplifier circuit may be stabilized because the decreased amplitude and the larger duty cycle may cancel at least a part of each other, which achieves the effect of negative feedback. Therefore, the final power of the output signal $U_0$ does not fluctuate much following the fluctuation of the supply voltage VCC. The stability of the output power ensures the quality of the audio output signal.

Compared with the prior art, the feedback circuit of the embodiments of the present disclosure filters the direct current signal generated by the power supply and reduces the output fluctuations because of the fluctuations in the DC signal. The embodiments do not need converting the PWM output signal to an analog signal. The embodiments do not need a phase shift conversion or a superimposition of the audio input signal and the feedback signal. The electronic device does not need an integrator in a feedback loop to the class-D amplifier as in the prior arts. In other words, the electronic device or electronic system does not need an integrator in a feedback loop that generates the negative feedback control signal. Thus, the present embodiments of the disclosure provide a simple feedback circuit design, without complex filter circuit. Further, there is no need to add the active devices, effectively reducing the design complexity of the feedback circuit. Thus, the cost of the feedback circuit is much less while the effect of the feedback circuit is almost the same.

Figure 9:
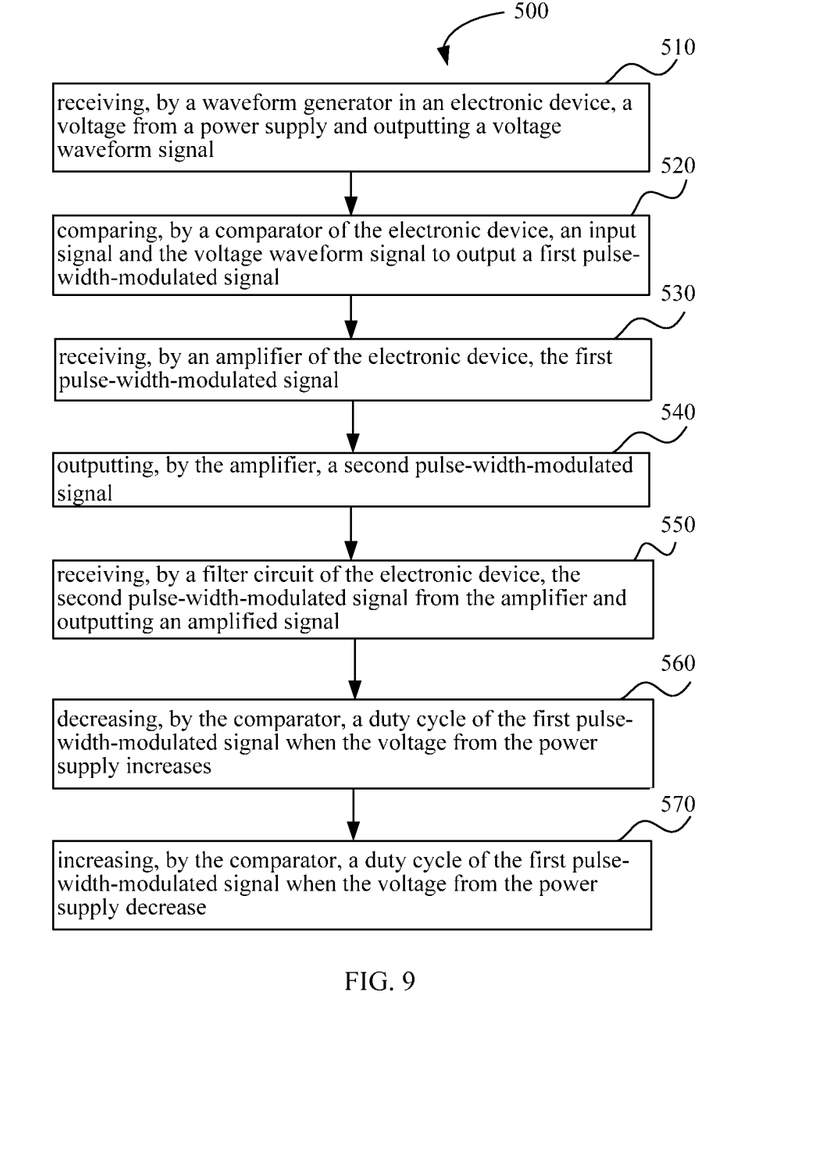
FIG. 9 is an example flowchart of a method according to embodiments of the present disclosure.

FIG. 9 is an example flowchart of a method according to embodiments of the present disclosure. In act 510, a waveform generator in an electronic device receives a voltage signal from a power supply and outputs a voltage waveform signal. The voltage waveform signal may include a triangular wave signal that serves as a negative feedback control signal to the electronic device.

In act 520, a comparator of the electronic device compares an analog signal and the voltage waveform signal to output a first PWM signal. In act 560, the comparator decreases a duty cycle of the first PWM signal when the voltage signal from the power supply increases. In act 570, the comparator increases a duty cycle of the first PWM signal when the voltage signal from the power supply decreases.

In act 530, an amplifier of the electronic device receives the first PWM signal. In act 540, the amplifier outputs a second PWM signal. The magnitude of the second PWM signal may be controlled at least partially by the amplitude of the power supply 105 shown in FIGS. 3-5. The duty ratio of the second PWM signal may be controlled at least partially by the duty ratio of the first PWM signal.

In act 550, a filter circuit of the electronic device receives the second pulse-width-modulated signal from the amplifier and outputs an amplified analog signal. The electronic device may include a second filter circuit that receives an input from the power supply and outputs a filtered power supply signal to a voltage divider circuit.

Note that each of the above resistor unit, the capacitor unit may be a combination of one or more circuit devices to achieve similar effects. For example, the resistance unit may include any of the above at least one resistor, the resistor unit may include at least two resistors, where the resistors may be connected in parallel within a resistors unit, and may also be connected in series. The resistance of the resistor may be fixed or may be changing. The capacitor unit may include at least one capacitor, when the capacitor unit includes at least two capacitors, the capacitors may be connected in parallel within a capacitor unit, and may also be connected in series, and the capacitance of the capacitor can be fixed or may be varied.

The present disclosure provides a novel electronic device that can smooth the output signal and reduces the complexity and cost of the feedback circuit by connecting the power supply directly to the waveform generator of the electronic device.

The above descriptions are merely preferred embodiments of the present disclosure, but not intended to limit the scope of the present disclosure. Any modification, equivalent replacement, or improvement made without departing from the spirit and principle of the present disclosure should fall within the scope of the present disclosure.

What is claimed is:

1. An electronic device, comprising:
a power supply;
a sampling circuit that includes a filter circuit that receives a voltage of the power supply and outputs a filtered voltage, and a voltage divider circuit that receives the filtered voltage and outputs a voltage divided version of the filtered voltage as an output of the sampling circuit;
a waveform generator that receives the output voltage of the sampling circuit and outputs a voltage waveform signal based on the output voltage of the sampling circuit;
a comparator that compares an input signal and the voltage waveform signal to output a first pulse-width-modulated signal; and
an amplifier that receives the first pulse-width-modulated signal and outputs a second pulse-width-modulated signal.

2. The electronic device of claim 1, wherein the voltage waveform signal comprises a non-sinusoidal wave signal that serves as a negative feedback control signal to the electronic device.

3. The electronic device of claim 1, further comprising:
a second filter circuit that receives the second pulse-width-modulated signal from the amplifier and outputs an amplified signal.

4. The electronic device of claim 3, wherein the waveform generator comprises a non-sinusoidal waveform generator that generates the voltage waveform signal based on the voltage.

5. The electronic device of claim 4, wherein the sampling circuit outputs a sampled voltage signal to the waveform generator.

6. The electronic device of claim 1, wherein the voltage divider circuit comprises a plurality of resistors connected in series.

7. The electronic device of claim 1, wherein when the voltage from the power supply rises, an amplitude of the voltage waveform signal increases and causes the comparator to decrease a duty cycle of the first pulse-width-modulated signal.

8. A method, comprising:
filtering a voltage of a power supply circuit to thereby generate a filter voltage;
dividing the filtered voltage to thereby generate a filtered-divided voltage;
generating, by a waveform generator of an electronic device, a voltage waveform signal based on the filtered-divided voltage;
comparing, by a comparator of the electronic device, an input signal and the voltage waveform signal to output a first pulse-width-modulated signal;

receiving, by an amplifier of the electronic device, the first pulse-width-modulated signal; and
outputting, by the amplifier, a second pulse-width-modulated signal.

9. The method of claim 8, wherein the voltage waveform signal comprises a non-sinusoidal wave signal that serves as a negative feedback control signal to the electronic device.

10. The method of claim 8, further comprising:
receiving, by a second filter circuit of the electronic device, the second pulse-width-modulated signal from the amplifier and outputting an amplified signal.

11. The method of claim 8, wherein the waveform generator is a non-sinusoidal waveform generator.

12. The method of claim 11, further comprising:
receiving, by a sampling circuit, the voltage from the power supply and outputting a sampled voltage signal to the waveform generator.

13. The method of claim 8, further comprising:
decreasing, by the comparator, a duty cycle of the first pulse-width-modulated signal when the voltage from the power supply increases.

14. The method of claim 8, further comprising:
increasing, by the comparator, a duty cycle of the first pulse-width-modulated signal when the voltage from the power supply decrease.

15. A system, comprising:
a class-D amplifier directly connected to a power supply, the class-D amplifier comprising:
a sampling circuit that includes a filter circuit that receives a voltage of the power supply and outputs a filtered voltage, and a voltage divider circuit that receives the filtered voltage and outputs a voltage divided version of the filtered voltage as an output of the sampling circuit;
a waveform generator that receives the output voltage of the sampling circuit and outputs a voltage waveform signal based on the output voltage of the sampling circuit; and
a comparator that compares an input signal and the voltage waveform signal to output a first pulse-width-modulated signal,
wherein the voltage waveform signal comprises a non-sinusoidal wave signal that serves as a negative feedback control signal to the class-D amplifier.

16. The system of claim 15, wherein the class-D amplifier receives the first pulse-width-modulated signal and outputs a second pulse-width-modulated signal.

17. The system of claim 15, wherein the waveform generator is a non-sinusoidal waveform generator, and wherein the system does not comprise an integrator in a feedback loop that generates the negative feedback control signal.

18. The system of claim 15, wherein:
when the voltage from the power supply increases, an amplitude of the voltage waveform signal increases and causes the comparator to decrease a duty cycle of the first pulse-width-modulated signal; and
when the voltage from the power supply decreases, the amplitude of the voltage waveform signal decreases and causes the comparator to increase the duty cycle of the first pulse-width-modulated signal.

* * * * *